(12) United States Patent
Komiyama

(10) Patent No.: US 6,329,708 B1
(45) Date of Patent: Dec. 11, 2001

(54) MICRO BALL GRID ARRAY SEMICONDUCTOR DEVICE AND SEMICONDUCTOR MODULE

(75) Inventor: Mitsuru Komiyama, Tokyo (JP)

(73) Assignee: Oki Electric Industry Co. Ltd., Tokyo (JP)

( * ) Notice: Subject to any disclaimer, the term of this patent is extended or adjusted under 35 U.S.C. 154(b) by 0 days.

(21) Appl. No.: 09/536,763

(22) Filed: Mar. 28, 2000

(30) Foreign Application Priority Data

Apr. 26, 1999  (JP) .................................................. 11-117442

(51) Int. Cl.[7] ............................. H01L 23/48; H01L 29/52
(52) U.S. Cl. ......................... 257/678; 257/692; 257/690; 257/694; 257/696; 257/666
(58) Field of Search ..................................... 257/692, 690, 257/694, 669, 695, 696, 666; 438/123, 118; 361/813, 749

(56) References Cited

U.S. PATENT DOCUMENTS

| | | | | |
|---|---|---|---|---|
| 5,714,405 | * | 2/1998 | Tsubosaki et al. | 438/123 |
| 5,805,422 | * | 9/1998 | Otake et al. | 361/749 |
| 5,895,970 | * | 4/1999 | Miyoshi | 257/696 |
| 6,002,167 | * | 12/1999 | Hatano et al. | 257/696 |
| 6,165,817 | * | 12/2000 | Akram et al. | 438/118 |

* cited by examiner

*Primary Examiner*—Jhihan B Clark
(74) *Attorney, Agent, or Firm*—Rabin & Berdo, P.C.

(57) ABSTRACT

The semiconductor device includes a semiconductor chip and tapes. The tape includes insulating layers with the conductive layers which are sandwiched between the insulating layers. The tapes extend from the front surface to the back surface of the semiconductor chip and are fixed to the chip. Each of the conductive layers is exposed at the front and the back sides of the chip, respectively.

12 Claims, 11 Drawing Sheets

MICRO BALL GRID ARRAY SEMICONDUCTOR DEVICE AND SEMICONDUCTOR MODULE

BACKGROUND OF THE INVENTION

1. Field of the Invention

The present invention relates to a semiconductor device and, more particularly, to a micro Ball Grid Array ($\mu$BGA) semiconductor device.

This application is a counterpart application of Japanese application Serial Number 117442/1999, filed Apr. 26, 1999, the subject matter of which is incorporated herein by reference.

2. Description of the Related Art

FIG. 1 is a cross-sectional view of a conventional $\mu$BGA semiconductor device. The conventional $\mu$BGA semiconductor device 1300 is made up of a semiconductor chip 1301, conductive layers or strips 1310 and a tape 1308. An integrated circuit having a plurality of external terminals 1304 is formed on a front or top surface of the semiconductor chip 1301. The tape 1308 includes insulating layers 1309, 1313 with the conductive layers which are sandwiched between the insulating layers 1309, 1313. For example, the conductive layer 1310 is made of copper (Cu). The insulating layer 1309 is made of polyimide or glass epoxy, while the insulating layer 1313 is made of solder resist.

A passivation layer 1305 covers the front surface of the semiconductor chip 1301. Each of the conductive layers 1310 is electrically connected to one of the plurality of external terminals 1304 and is exposed from an opening portion (hereinafter referred to as an "opening") 1303a. The tape 1308 is fixed to the passivation layer 1305 via a buffer layer 1307. The connection portions of the conductive layers 1310 to the external terminals 1304 are covered by a resin 1302.

The conventional $\mu$BGA semiconductor device, however, can not be stacked and mounted on the board, since the exposed regions of the conductive layers 1310 from the openings 1303a, which are used for electrical connection with the other external device such as a semiconductor device, are formed only on the front side of the semiconductor chip 1301.

SUMMARY OF THE INVENTION

Accordingly, it is an object of the present invention to provide a semiconductor device and a semiconductor module which can be stacked and mounted quite readily.

To achieve the object, according to one aspect of the present invention, there is provided a semiconductor device, which is made up of a semiconductor chip including an integrated circuit (not shown) having a plurality of external terminals, the integrated circuit being formed on a front surface of the semiconductor chip; and a tape extending from the front surface to a back or bottom surface of the semiconductor chip and being fixed to the semiconductor chip on the front and the back sides of the semiconductor chip; wherein the tape includes insulating layers and a plurality of conductive layers that are sandwiched between the insulating layers, each of the plurality of conductive layers is electrically connected to one of the plurality of external terminals, and the plurality of conductive layers are exposed from opening portions of the insulating layer at the front side and the back side of the semiconductor chip.

According to another aspect of the present invention, there is provided a semiconductor module, which is made up of a first semiconductor device having a semiconductor chip including an integrated circuit with a plurality of external terminals, the integrated circuit being formed on a front surface of the semiconductor chip; and a tape extending from the front surface to a back surface of the semiconductor chip and being fixed to the semiconductor chip on the front and the back sides of the semiconductor chip; wherein the tape includes insulating layers and a plurality of conductive layers that are sandwiched between the insulating layers, each of the plurality of conductive layers is electrically connected to one of the plurality of external terminals, and the plurality of conductive layers are exposed from opening portions of the insulating layer at the front side and the back side of the semiconductor chip; and a second semiconductor device being electrically connected to the exposed conductive layers from the opening portions.

DETAILED DESCRIPTION OF THE PREFERRED EMBODIMENT

A preferred embodiment of the present invention will now be described referring to the accompanying drawings.

Figure 1:
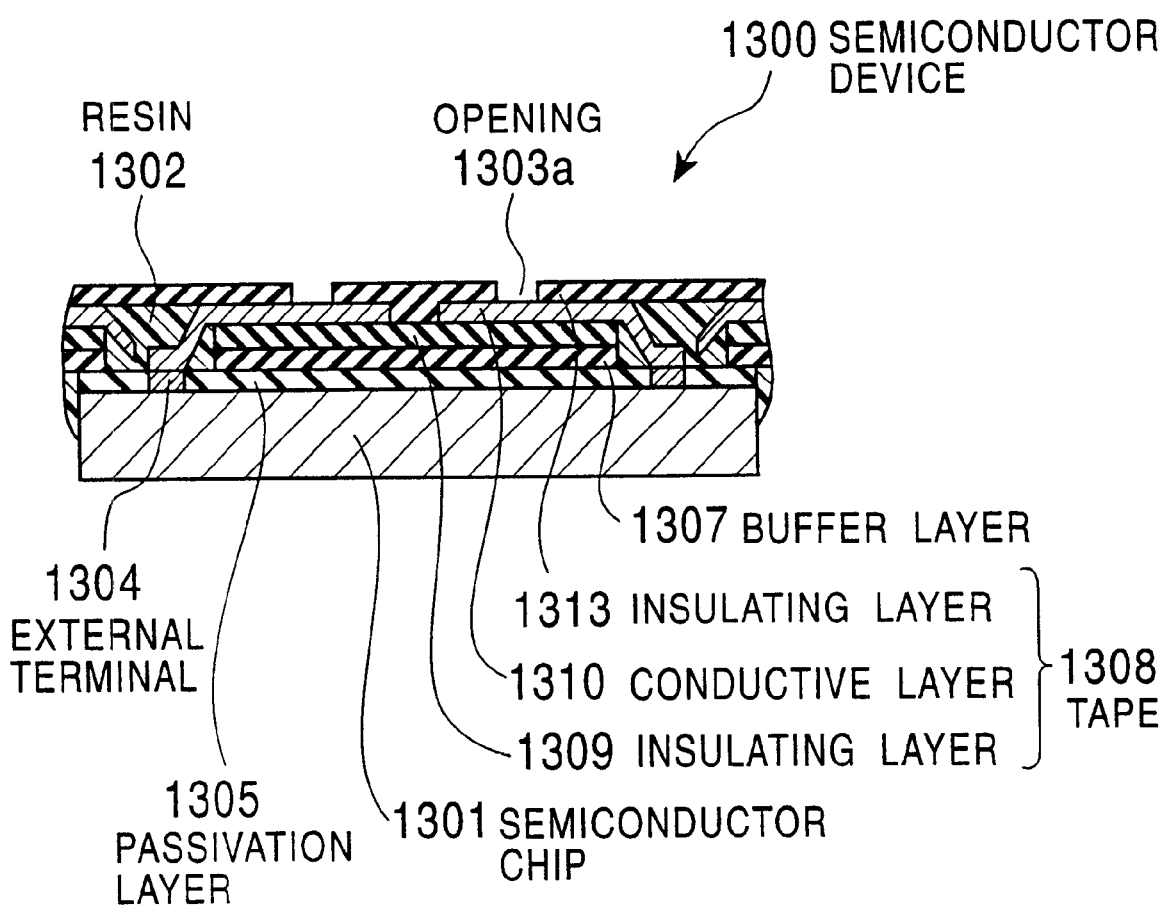
FIG. 1 is a cross-sectional view showing the structure of a conventional $\mu$BGA semiconductor device.
Figure 2:
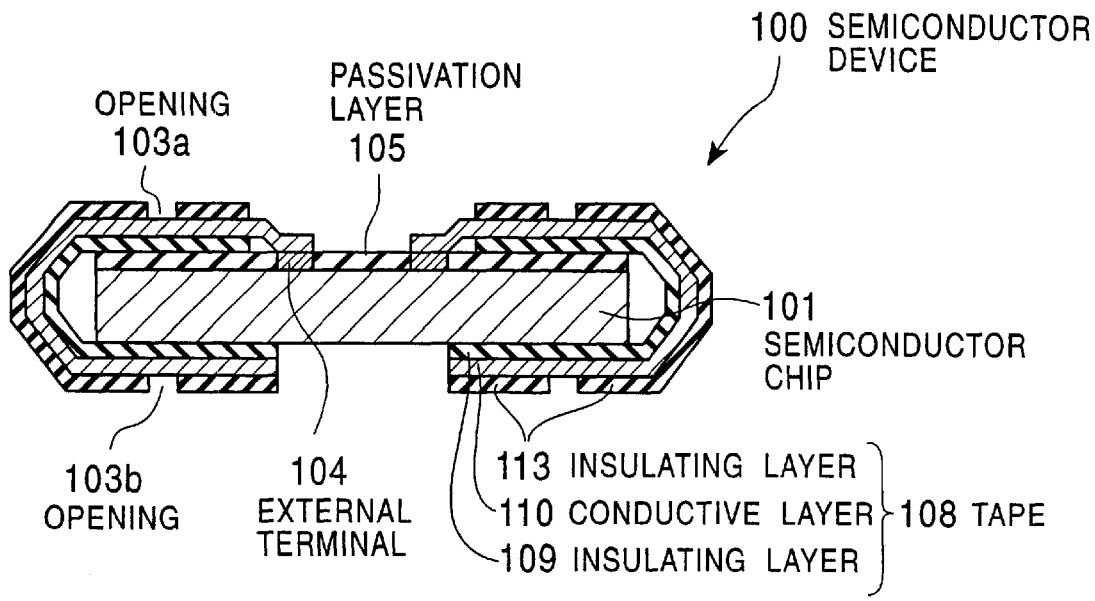
FIG. 2 is a cross-sectional view showing the structure of a semiconductor device according to a first embodiment of the present invention.

FIG. 2 is a cross-sectional view showing the structure of a semiconductor device according to a first preferred embodiment of the present invention.

The semiconductor device 100 is preferably made up of a semiconductor chip 101, conductive layer elements or strips 110 and tapes 108. As used in hereinafter, the layer elements or strips will simply be referred to as conductive layers. An integrated circuit having a plurality of external terminals 104 is formed on a front or top surface of the semiconductor chip 101. The tape 108 includes insulating layers 109, 113 with the conductive layers which are sandwiched between the insulating layers 109, 113. For example, the conductive layers 110 are made of copper (Cu). The insulating layer 109 is made of polyimide or glass epoxy, while the insulating layer 113 is made of solder resist.

The front surface of the semiconductor chip 101 is covered by a passivation layer 105. The tapes 108 are extending from the front surface to a back or bottom surface of the semiconductor chip 101 and are fixed to the chip 101 on the front and the back sides of the chip 101.

Each of the conductive layers 110 is electrically connected to one of the plurality of external terminals 104 and is exposed at opening portions (hereinafter, simply referred to as "openings") 103a and 103b which are formed in the insulating layer 113 on the front and the back sides of the chip 101, respectively.

As described above, in the semiconductor device 100 according to the first embodiment of the present invention, first, a region of the conductive layer 110 which is exposed from the opening 103a, or a region of the conductive layer 110 which is exposed from the opening 103b, or both of the regions can be electrically connected to external device such as a semiconductor device, since the openings 103a and 103b are provided on the front and the back sides of the chip 101, respectively. Thus, a plurality of semiconductor devices can be stacked and packaged quite readily.

Second, when either of the openings 103a or the openings 103b are used for electrical connection to the other semiconductor device, the other openings can be used, for example, for electrical test on the semiconductor device 100.

It should be noted, in the first embodiment of the present invention, that the exposed regions of the conductive layer 110 from the openings 103a, 103b can be electrically connected to the other semiconductor devices via, for example, metal bumps. In this case, the metal bumps can be mounted accurately when insulating material having low affinity to melted metal, for example, solder resist is used for the insulating layer. Instead of the tape 108, a flexible tape may be used.

Figure 3:
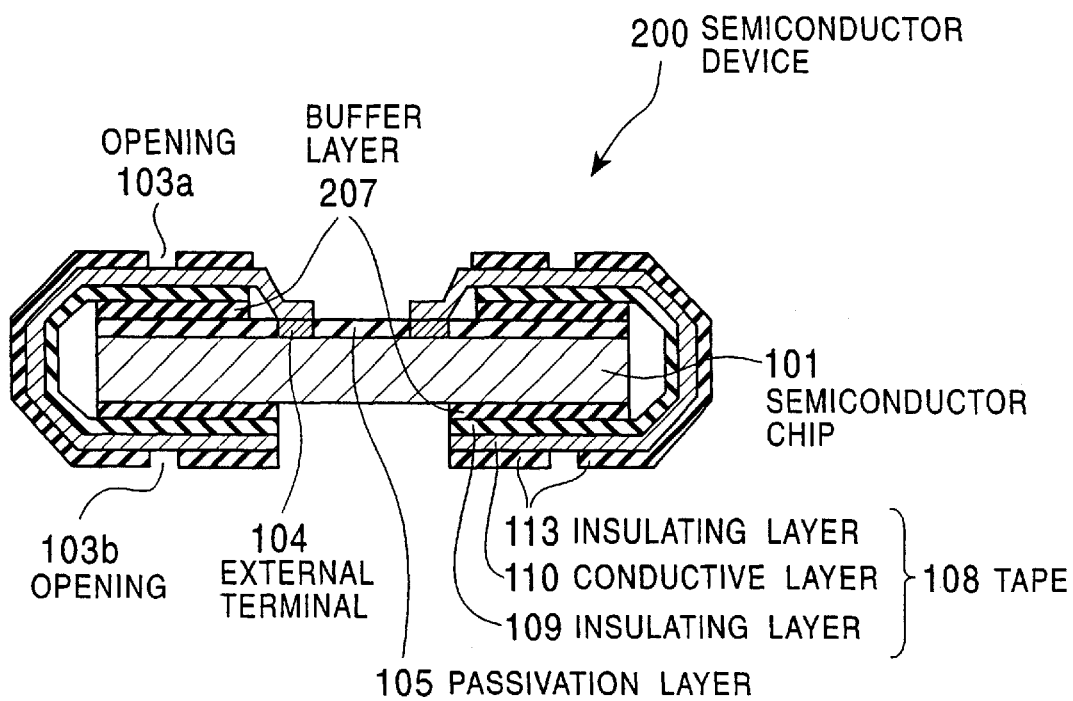
FIG. 3 is a cross-sectional view showing the structure of a semiconductor device according to a second embodiment of the present invention.

FIG. 3 is a cross-sectional view showing the structure of a semiconductor device according to a second embodiment of the present invention.

The configuration of the semiconductor device 200 is similar to that of the semiconductor device 100 of the first embodiment except that the tapes 108 are fixed to the semiconductor chip 101 via buffer layers 207. The buffer layer 207 may be an elastomer.

It should be noted that the semiconductor device 200 of the second embodiment has a similar effect as in the case of the semiconductor device 100 of the first embodiment. Furthermore, in the second embodiment, the buffer layer 207 is provided between the semiconductor chip 101 and the tape 108 as mentioned above. The buffer layer 207 serves to prevent the tape 108 from stripping off from the semiconductor chip 101 owing to a difference in the thermal expansion ratios. Thus, in the semiconductor device 200 of the second embodiment, the tape 108 is more resistant to coming off or detaching from the semiconductor chip 101 as compared to the case of the semiconductor device 100 of the first embodiment.

Figure 4:
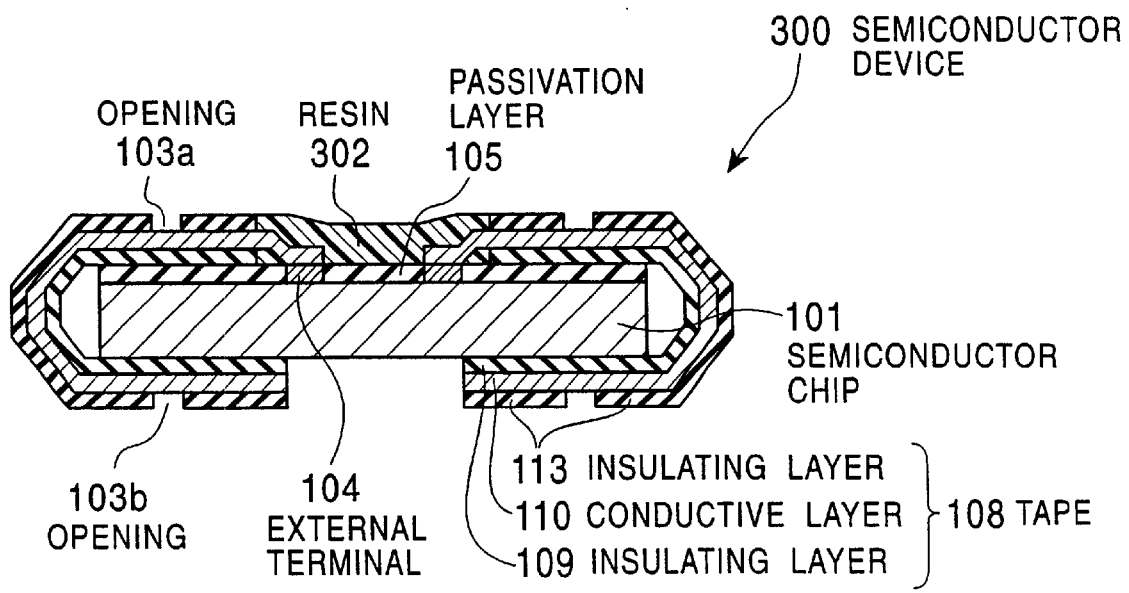
FIG. 4 is a cross-sectional view showing the structure of a semiconductor device according to a third embodiment of the present invention.

FIG. 4 is a cross-sectional view showing the structure of a semiconductor device according to a third embodiment of the present invention.

The configuration of the semiconductor device 300 is similar to that of the semiconductor device 100 of the first embodiment. The third embodiment has a feature that the connection portion of the conductive layer 110 connecting to the external terminal 104 is covered by a resin 302.

It should be noted that the semiconductor device 300 of the third embodiment has a similar effect as in the case of the semiconductor device 100 of the first embodiment. Furthermore, in the third embodiment, the conductive layer 110 and the external terminal 104 are resistant to detaching as compared to those of the semiconductor device 100 of the first embodiment, since the connection portions of the conductive layers 110 to the external terminals 104 are covered by a resin 302 as mentioned above. Thus, the semiconductor device 300 has firmer structure than the semiconductor device 100.

Figure 5:
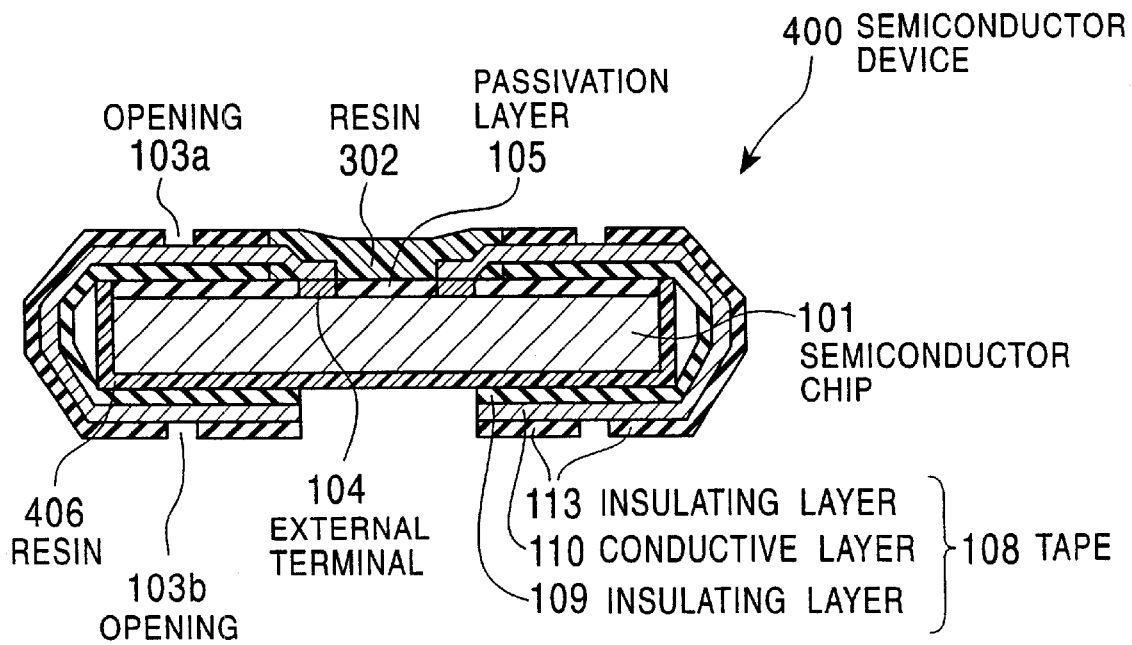
FIG. 5 is a cross-sectional view showing the structure of a semiconductor device according to a fourth embodiment of the present invention.

FIG. 5 is a cross-sectional view showing the structure of a semiconductor device according to a fourth embodiment of the present invention.

The configuration of the semiconductor device 400 is similar to that of the semiconductor device 100 of the first embodiment. The connection portions of the conductive layers 110 to the external terminals 104 are covered by a resin 302. Furthermore, in the fourth embodiment, the side surfaces and the back surface of the semiconductor chip 101 are covered by a resin 406.

The semiconductor device 400 of the fourth embodiment has a similar effect as in the case of the semiconductor device 100 of the first embodiment. Furthermore, the semiconductor device 400 has a firmer structure than the semiconductor device 100, since the semiconductor device 400 is resistant against external forces in the direction of the front surface of the semiconductor chip 101.

Figure 6:
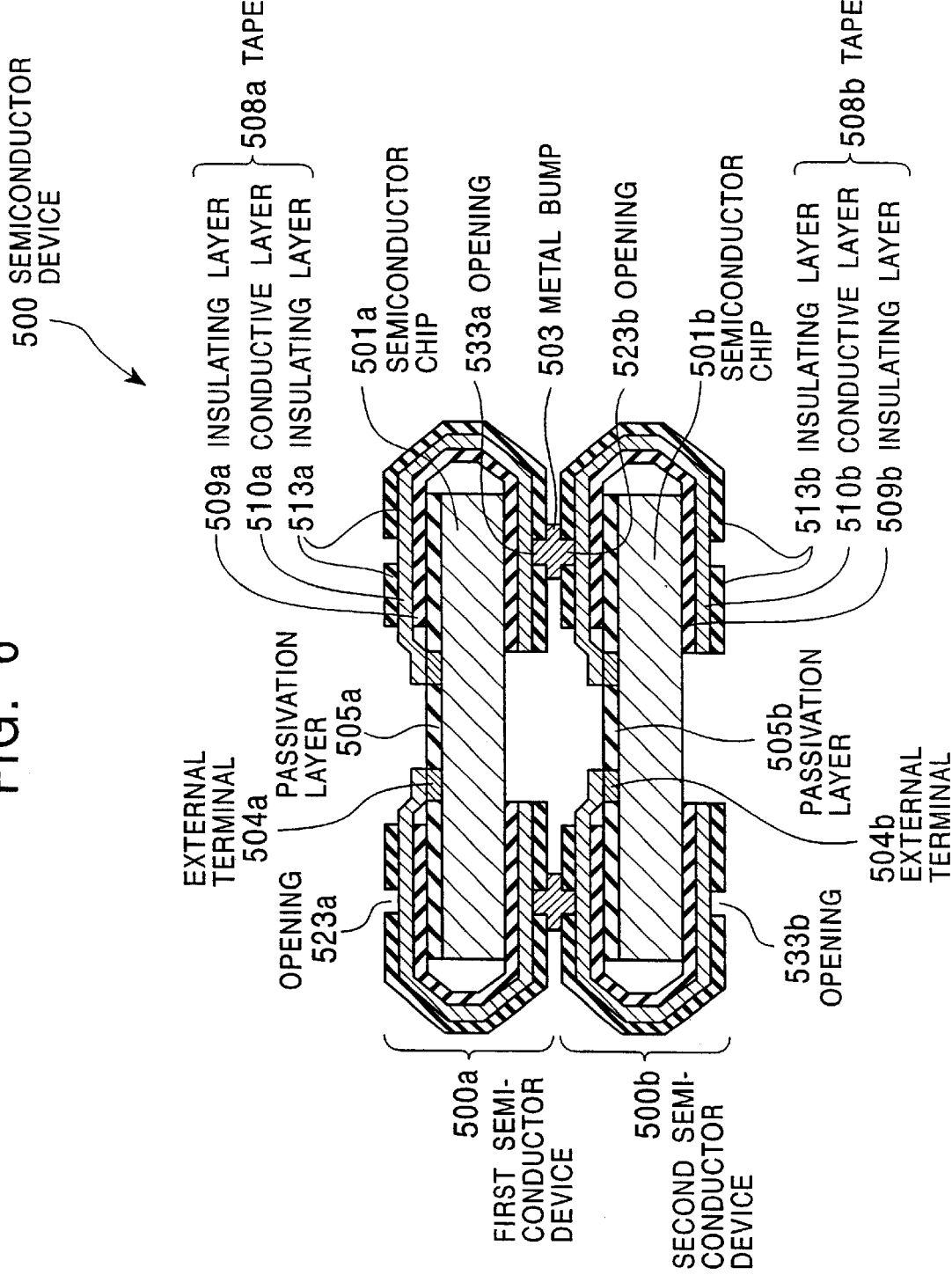
FIG. 6 is a cross-sectional view showing the structure of a semiconductor module according to a fifth embodiment of the present invention.

FIG. 6 is a cross-sectional view showing the structure of a semiconductor module according to a fifth embodiment of the present invention.

The semiconductor module 500 is made up of a first semiconductor device 500a and a second semiconductor device 500b. In the following description, only the first semiconductor device 500a will be described, since the second semiconductor device 500b has the same structure as the first semiconductor device 500a.

The semiconductor device 500a is made up of a semiconductor chip 501a, conductive layers 510a and tapes 508a. An integrated circuit (not shown) having a plurality of external terminals 504a is formed on a front surface of the semiconductor chip 501a. The tape 508a includes insulating layers 509a, 513a and the conductive layers 510a which are sandwiched between the insulating layers 509a, 513a. For example, the conductive layer 510a is made of copper (Cu). The insulating layer 509a is made of polyimide or glass epoxy, while the insulating layer 513a is made of solder resist.

The front surface of the semiconductor chip 501a is covered by a passivation layer 505a. The tapes 508a are extending from the front surface to a back surface of the semiconductor chip 501a and are fixed to the chip 501a on the front and the back sides of the chip 501a.

The conductive layers 510a are electrically connected to a plurality of external terminals 504a and are exposed from openings 523a and 523b which are formed in the insulating layer 513a on the front and the back sides of the chip 501a, respectively.

As described above, in the semiconductor module 500 according to the fifth embodiment of the present invention, the conductive layers 510a which are exposed from the openings 533a, are electrically connected to the conductive layers 510b which are exposed from the openings 523b. Concretely the conductive layers 510a are connected to the conductive layers 510b via the metal bump. The semiconductor module 500 comprising the first and the second semiconductor devices 500a, 500b can be obtained in this manner.

The semiconductor module 500 has a structure as mentioned above, the semiconductor devices having the tapes can be stacked and packaged quite readily. In addition, the packaging process can be simplified. Thus, the manufacturing costs can be greatly reduced.

Figure 7:
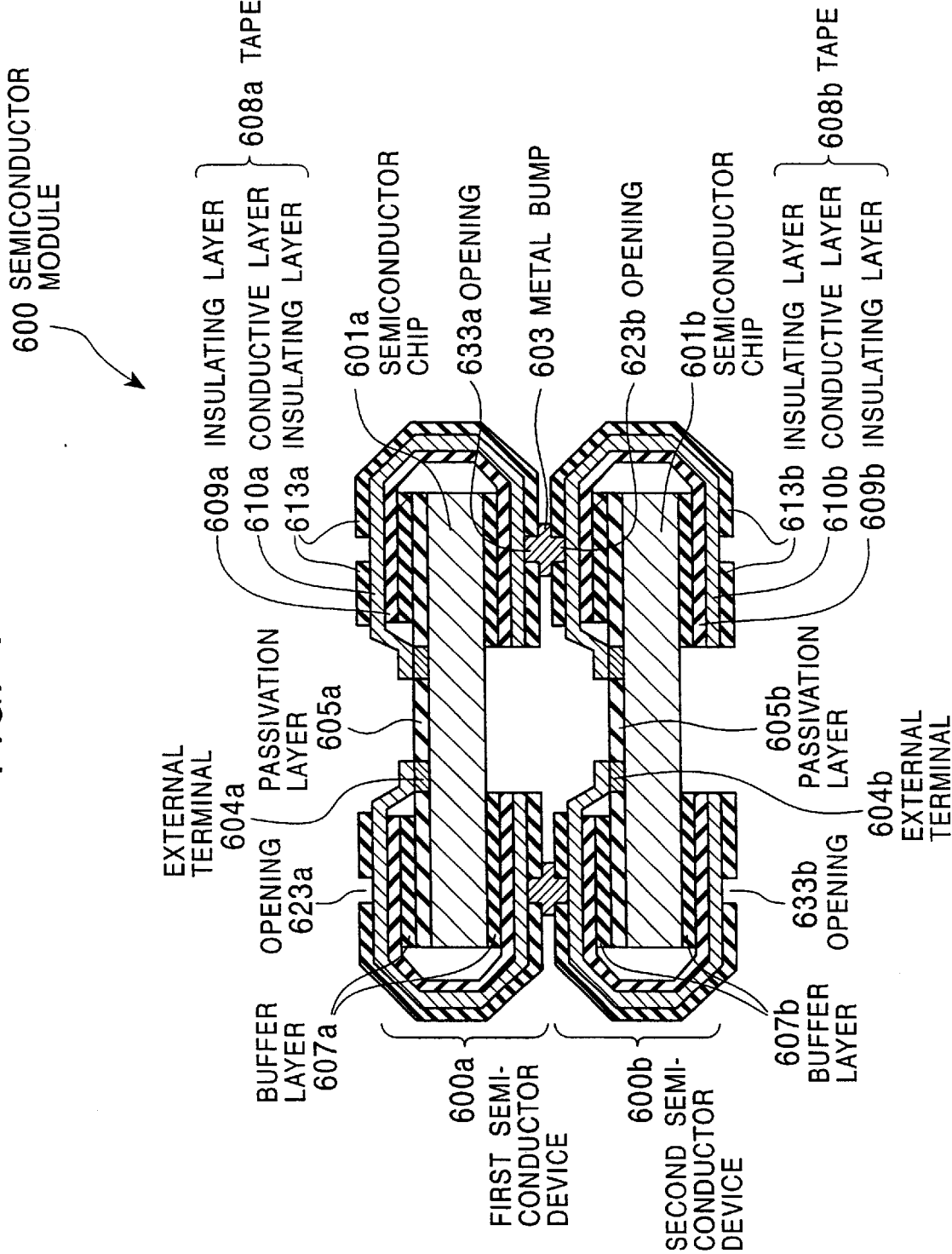
FIG. 7 is a cross-sectional view showing the structure of a semiconductor module according to a sixth embodiment of the present invention.

FIG. 7 is a cross-sectional view showing the structure of a semiconductor module according to a sixth embodiment of the present invention.

The configuration of the semiconductor module 600 according to the sixth embodiment of the present invention is similar to that of the semiconductor module 500 of the aforementioned fifth embodiment. In the semiconductor devices 600a, 600b of the semiconductor module 600, tapes 608a, 608b are fixed to semiconductor chips 601a, 601b via buffer layers 607a, 607b, respectively. The buffer layers 607a, 607b may be elastomers.

It should be noted that the semiconductor module 600 has a similar effect as in the case of the semiconductor module 500 according to the aforementioned fifth embodiment. Furthermore, the buffer layers 607a, 607b are provided between the semiconductor chip 101 and the tapes 608a, 608b as mentioned above. The buffer layers 607a, 607b serve to prevent the tapes 608a, 608b from detaching from the semiconductor chips 601a, 601b, respectively, owing to a difference in the thermal expansion ratios. Thus, the semiconductor module 600 of the sixth embodiment has a configuration that the tapes 608a, 608b and the semiconductor chips 601a, 601b are more resistant to peeling off as compared to the case of the semiconductor module 500 of the fifth embodiment.

Figure 8:
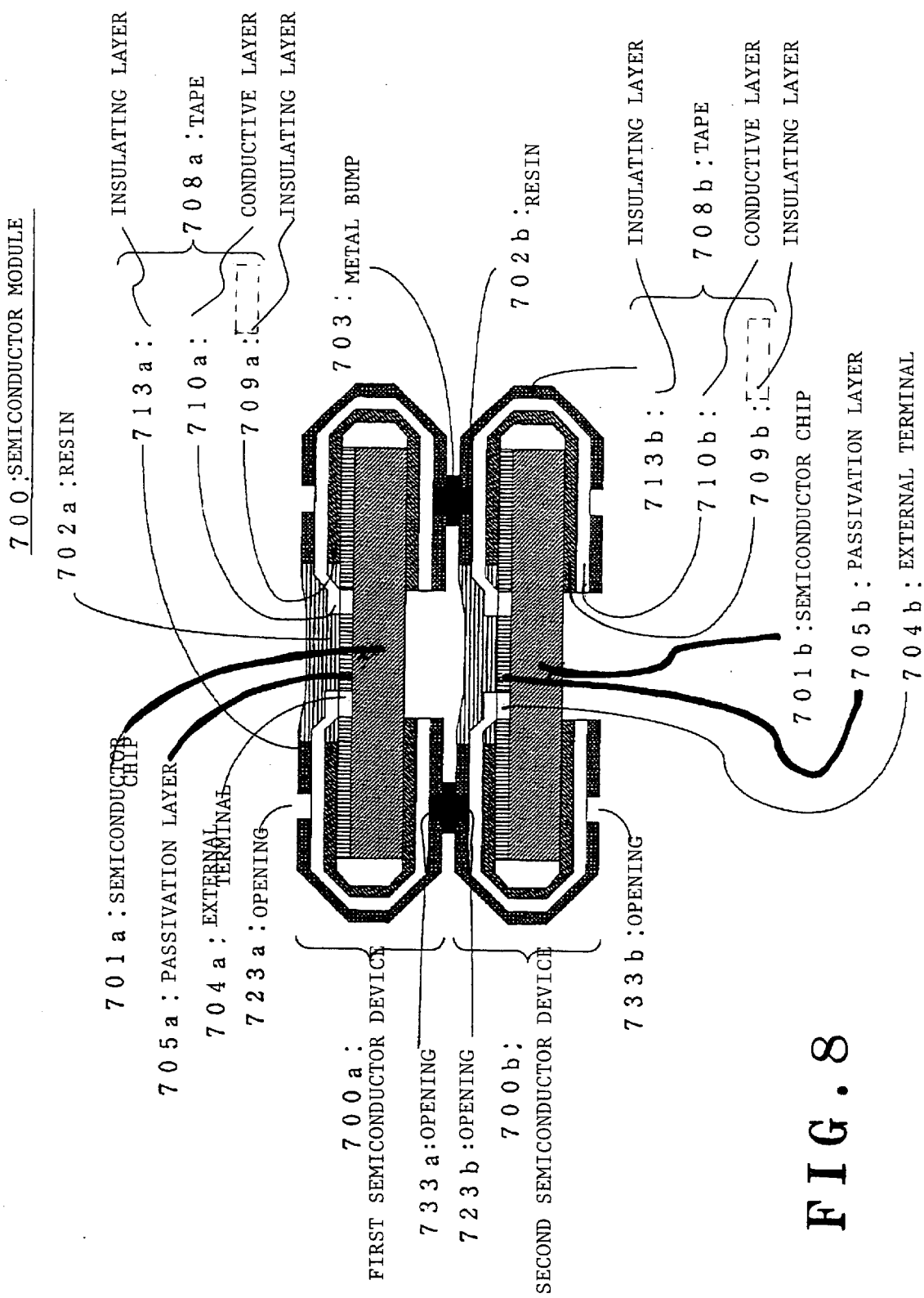
FIG. 8 is a cross-sectional view showing the structure of a semiconductor module according to a seventh embodiment of the present invention.

FIG. 8 is a cross-sectional view showing the structure of a semiconductor module according to a seventh embodiment of the present invention.

The configuration of the semiconductor module 700 according to the seventh embodiment of the present invention is similar to that of the semiconductor module 500 of the aforementioned fifth embodiment. In the semiconductor devices 700a, 700b of the semiconductor module 700, the connection portions of a conductive layers 710a to external terminals 704a and the connection portions of conductive layers 710b to external terminals 704b are covered by resins 702a and 702b, respectively.

It should be noted that the semiconductor module 700 has a similar effect as in the case of the semiconductor module 500 of the aforementioned fifth embodiment. Furthermore, as mentioned above, the connection portions are covered by the resins in the seventh embodiment. Thus, the semiconductor module 700 has a configuration that the connections of the conductive layers 710a, 710b to the respective external terminals 704a, 704b are more resistant to peeling off as compared to the case of the semiconductor module 500 of the fifth embodiment.

Figure 9:
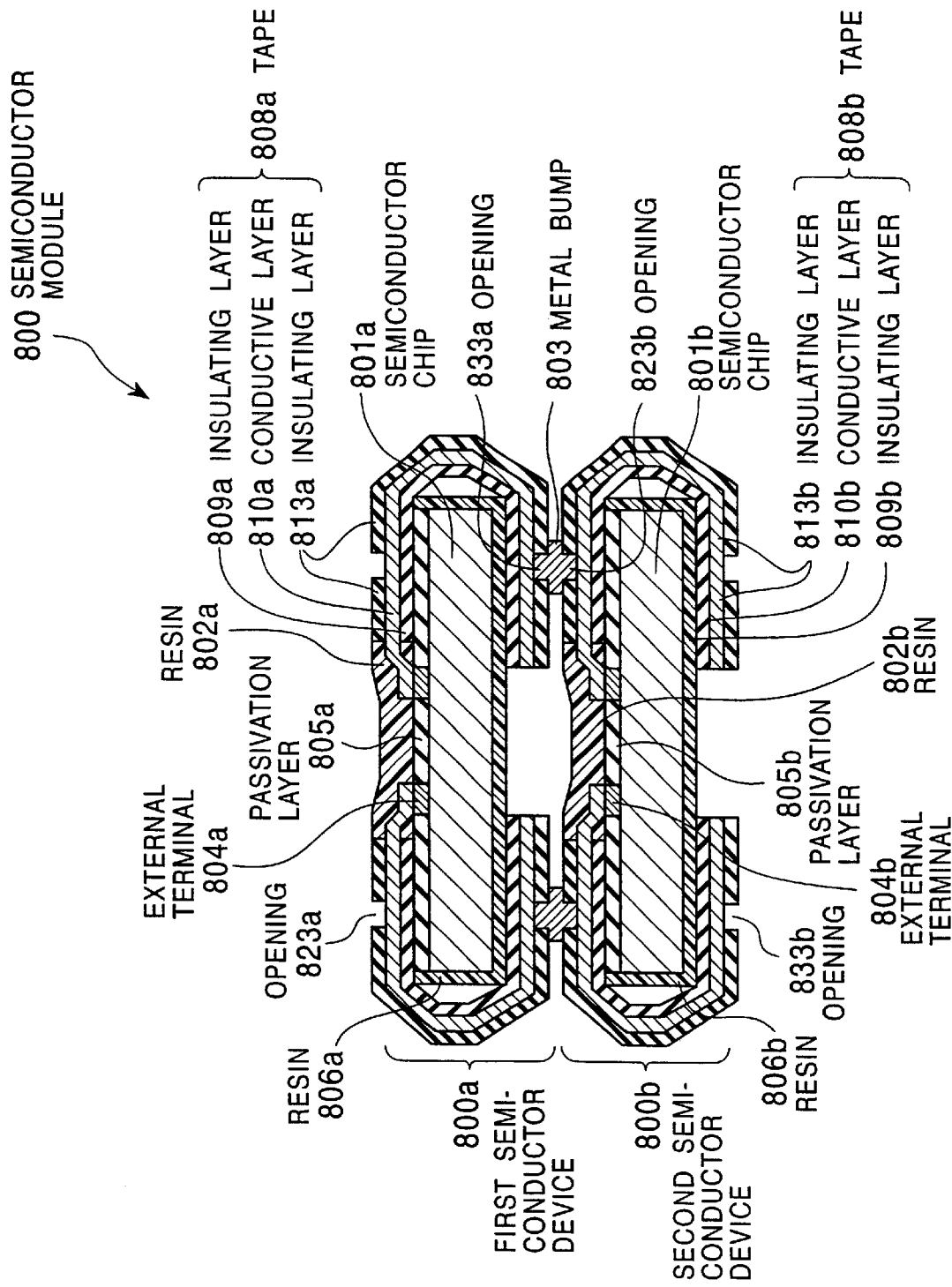
FIG. 9 is a cross-sectional view showing the structure of a semiconductor module according to a eighth embodiment of the present invention.

FIG. 9 is a cross-sectional view showing the structure of a semiconductor module according to an eighth embodiment of the present invention.

The configuration of the semiconductor module 800 according to the eighth embodiment of the present invention is similar to that of the semiconductor module 500 of the aforementioned fifth embodiment. In the semiconductor devices 800a, 800b of the semiconductor module 800, as shown in FIG. 9, the connection portion of a conductive layer 810a to an external terminal 804a, the side surfaces and a back surface of a semiconductor chip 801a, the connection portion of a conductive layer 810b to an external terminal 804b, and the side surfaces and the back surface of a semiconductor chip 801b are covered by resins 802a, 806a, 802b and 806b, respectively.

It should be noted that the semiconductor module 800 has a similar effect as in the case of the semiconductor module 500 of the aforementioned fifth embodiment. Furthermore, as mentioned above, the connection portions and the side and the back surfaces of the semiconductor chips are covered by the resins in the eighth embodiment. Thus, the semiconductor module 800 has a firmer structure than the semiconductor module 500, since the semiconductor module 800 is resistant against external forces in the direction of the front surfaces of the semiconductor chips 801a and 801b.

Figure 10:
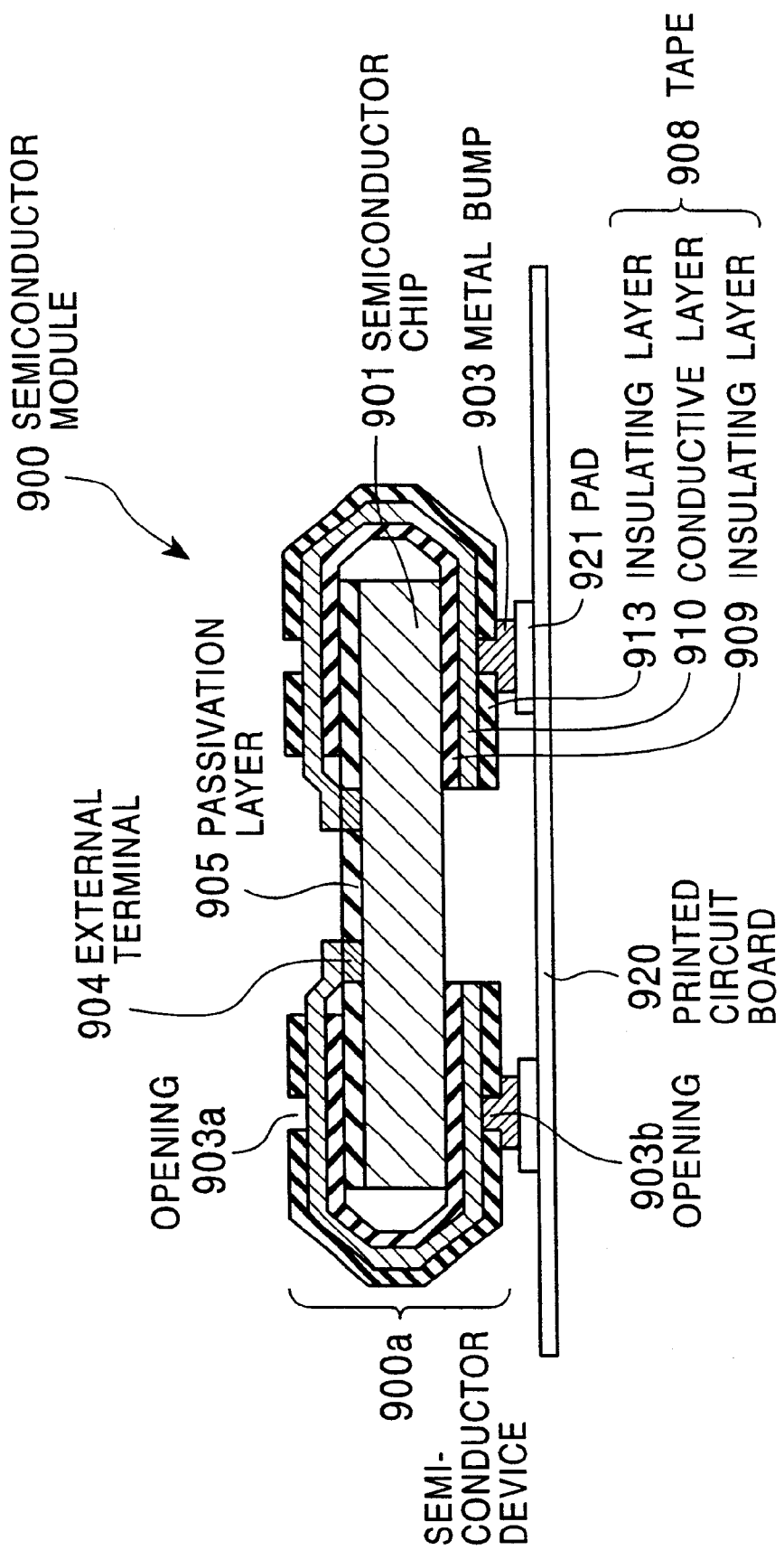
FIG. 10 is a cross-sectional view showing the structure of a semiconductor module according to a ninth embodiment of the present invention.

FIG. 10 is a cross-sectional view showing the structure of a semiconductor module according to a ninth embodiment of the present invention.

The semiconductor module 900 is made up of a semiconductor device 900a and a printed circuit board 920. The semiconductor device 900a includes a semiconductor chip 901, conductive layers 910 and tapes 908. An integrated circuit (not shown) having a plurality of external terminals 904 is formed on a front surface of the semiconductor chip 901. The tape 908 includes insulating layers 909, 913 and conductive layers 910 which are sandwiched between the insulating layers 909, 913. The conductive layer 910 is made of copper (Cu), for example. The insulating layer 909 is made of polyimide or glass epoxy, while the insulating layer 913 is made of solder resist.

The front surface of the semiconductor chip 901 is covered by a passivation layer 905. The tapes 908 are extending from the front surface to a back surface of the semiconductor chip 901 and are fixed to the chip 901 on the front and the back sides of the chip 901.

Each of the conductive layers 910 is electrically connected to one of a plurality of external terminals 904 and is exposed at openings 903a and 903b which are formed in the insulating layers 913 on the front and the back sides of the chip 901, respectively.

The surface of the conductive layer 910 which is exposed from the opening 903b of the semiconductor device 900a is electrically connected to a pad 921 on the printed circuit board 920 via metal bumps 903. The pad 921 may be made of Ni-Au or solder.

As described above, in the semiconductor module 900 according to the ninth embodiment of the present invention, the openings 903a of the conductive layers 910 are provided on the front surface of the semiconductor chip 901. Thus, the semiconductor device 900a can be easily stacked and mounted on the printed circuit board 920. Furthermore, the openings 903a of the conductive layers 910 which are not used for packaging can be utilized, for example, for testing the electrical connection between the semiconductor device 900a and the printed circuit board 920.

Figure 11:
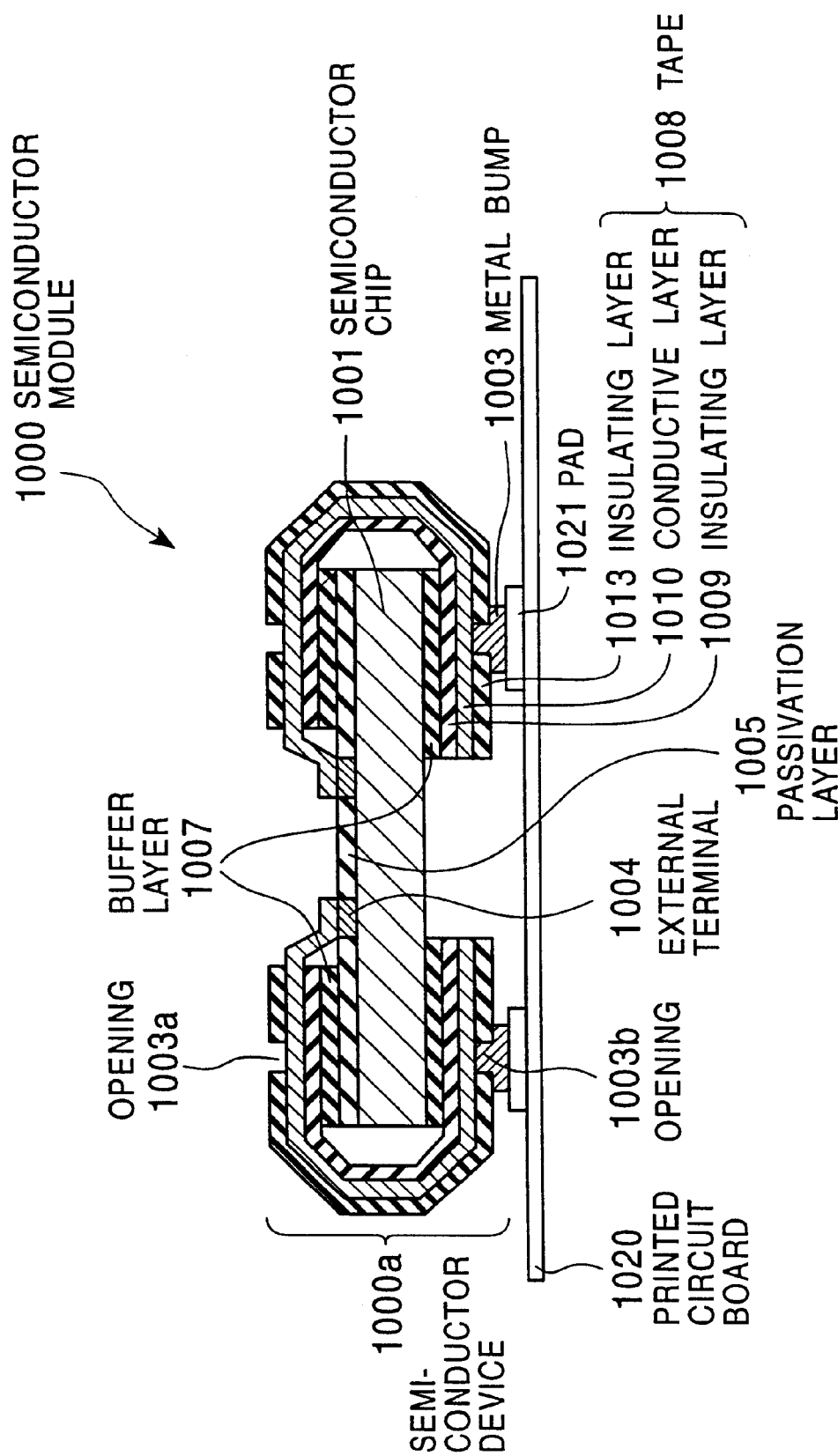
FIG. 11 is a cross-sectional view showing the structure of a semiconductor module according to a tenth embodiment of the present invention.

FIG. 11 is a cross-sectional view showing the structure of a semiconductor module according to a tenth embodiment of the present invention.

The configuration of the semiconductor module 1000 according to the tenth embodiment of the present invention is similar to that of the semiconductor module 900 of the aforementioned ninth embodiment. In the semiconductor devices 1000a of the semiconductor module 1000, tapes 1008 are fixed to semiconductor chips 1001 via buffer layers 1007. The buffer layers 1007 may be elastomers.

It should be noted that the semiconductor module 1000 has a similar effect as in the case of the semiconductor module 900 according to the ninth embodiment of the present invention. Furthermore, the buffer layers 1007 are provided in the ninth embodiment. The buffer layers 1007 serve to prevent the tapes 1008 from detaching from the semiconductor chip 1001. Thus, the semiconductor module 1000 has a configuration that the tapes 1008 are more resistant to detaching from the semiconductor chip 1001 as compared to the case of the semiconductor module 900 of the ninth embodiment.

Figure 12:
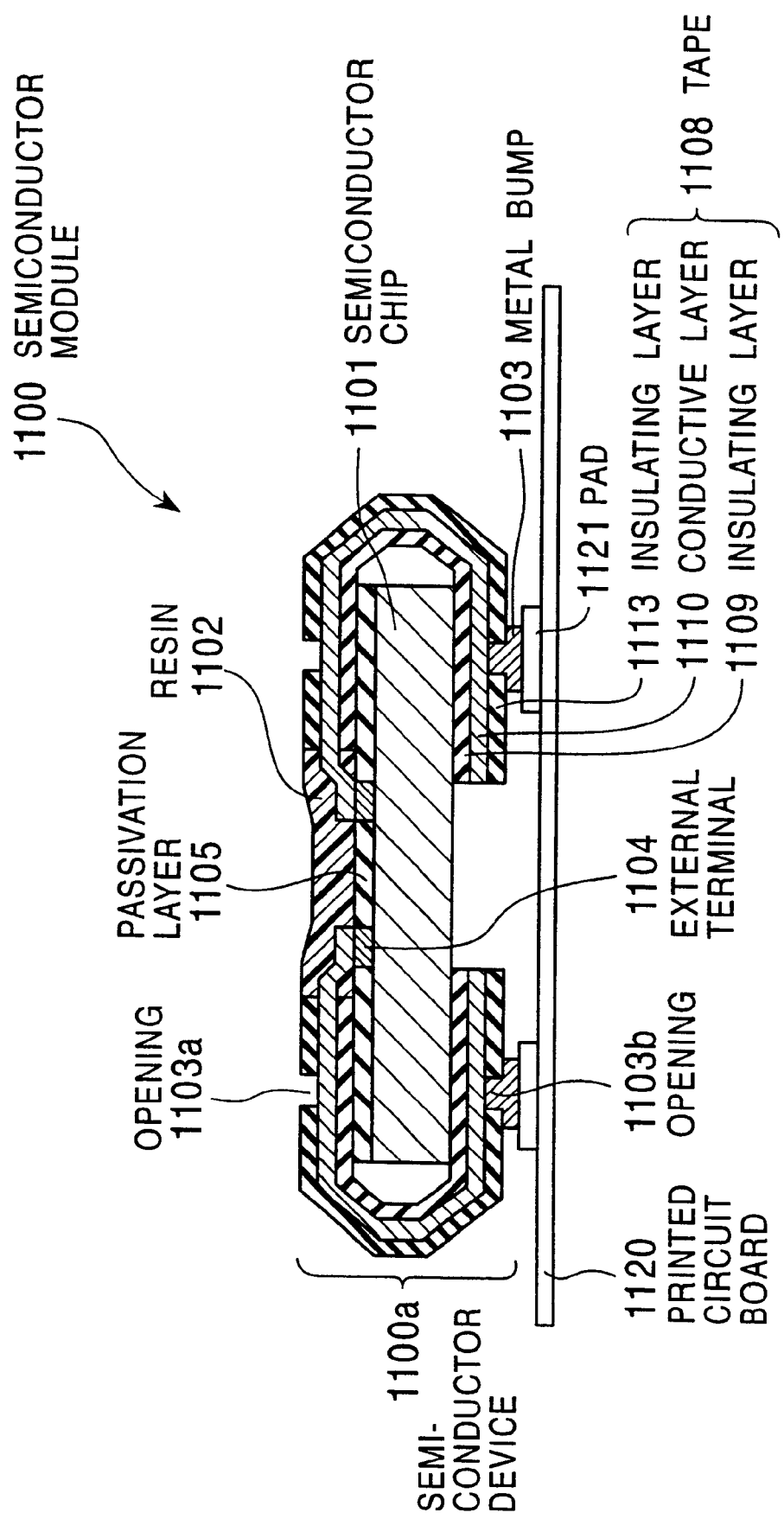
FIG. 12 is a cross-sectional view showing the structure of a semiconductor module according to a eleventh embodiment of the present invention.

FIG. 12 is a cross-sectional view showing the structure of a semiconductor module according to a eleventh embodiment of the present invention.

The configuration of the semiconductor module 1100 according to the eleventh embodiment of the present invention is similar to that of the semiconductor module 900a of the aforementioned ninth embodiment. In the semiconductor devices 1100a of the semiconductor module 1100, the connection portions of conductive layers 1110 to external terminals 1104 are covered by a resin 1102.

It should be noted that the semiconductor module 1100 has a similar effect as in the case of the semiconductor module 900 of the ninth embodiment. Furthermore, as mentioned above, the connection portions are covered by the resin in the eleventh embodiment. Thus, the semiconductor module 1100 has a configuration that the connections of the conductive layers 1110 to the external terminals 1104 are more resistant to peeling off as compared to the case of the semiconductor module 900 of the ninth embodiment.

Figure 13:
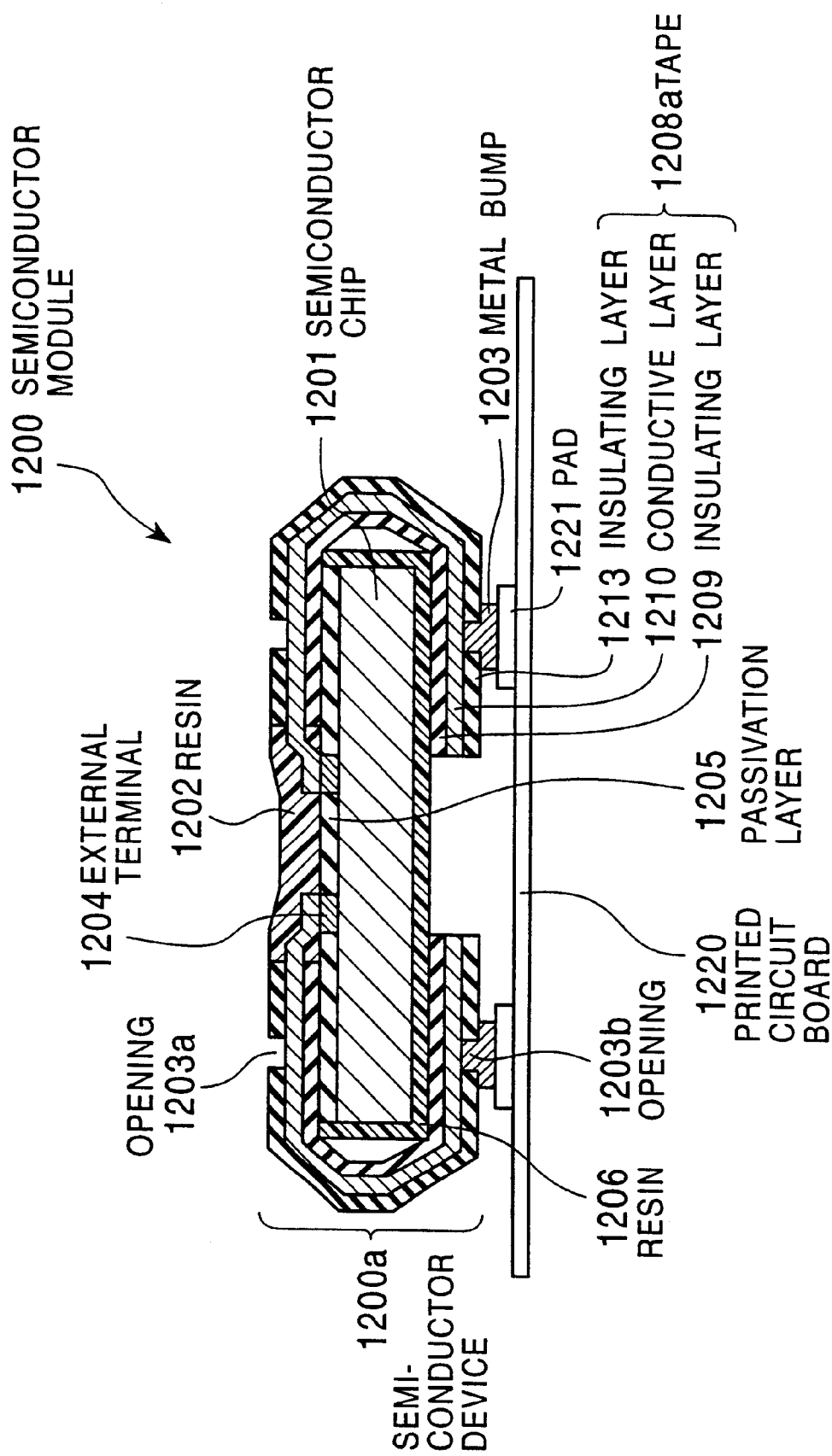
FIG. 13 is a cross-sectional view showing the structure of a semiconductor module according to a twelfth embodiment of the present invention.

FIG. 13 is a cross-sectional view showing the structure of a semiconductor module according to an twelfth embodiment of the present invention.

The configuration of the semiconductor module 1200 according to the twelfth embodiment of the present invention is similar to that of the semiconductor module 900 of the aforementioned ninth embodiment. In the semiconductor devices 1200a of the semiconductor module 1200, the connection portions of conductive layers 1210 to external terminals 1204 are covered by a resin 1202, and the side surfaces and a back surface of a semiconductor chip 1201 are covered by a resin 1206.

It should be noted that the semiconductor module 1200 has a similar effect as in the case of the semiconductor module 900 of the ninth embodiment. Furthermore, as mentioned above, the connection portions and the side and the back surfaces of the semiconductor chips are covered by the resins in the twelfth embodiment. Thus, the semiconductor module 1200 has a firmer structure than the semiconductor module 900, since the semiconductor module 1200 is resistant to external forces in the direction of a front surface of the semiconductor chip 1201.

As described above, in the semiconductor module according to the present invention, the openings are provided on the front and the back surfaces of the semiconductor device. The conductive layers which are exposed from the openings of the front and the back surfaces, or both can be electrically connected to external devices such as semiconductor devices. Thus, a plurality of semiconductor devices can be stacked and quite readily.

Further, when the exposed regions of the one side is used for electrical connection to other device, the other exposed regions can be used for various purposes such as an electrical test of the semiconductor device itself.

Still further, in the semiconductor module according to the present invention, the first semiconductor device can be electrically connected to the second semiconductor device or the printed circuit board via the openings. Thus, the semiconductor module according to the present invention enables a plurality of the semiconductor devices to be stacked and mounted quite readily. In addition, the mounting process can be simplified. Therefore, the manufacturing costs can be reduced.

The present invention has been described with reference to the preferred embodiments thereof. It should be understood by those skilled in the art that a variety of alternations and modifications may be made from the embodiments described above. It is therefore contemplated that the appended claims encompass all such alternations and modifications.

What is claimed is:

1. A semiconductor device comprising:
   a semiconductor chip which includes an integrated circuit having a plurality of external terminals, said integrated circuit being formed on a front surface of said semiconductor chip; and
   a tape which extends from the front surface to a back surface of said semiconductor chip and being fixed to said semiconductor chip on the front and the back sides of said semiconductor chip;
   wherein said tape includes insulating layers and a plurality of conductive layers that are sandwiched between said insulating layers, each of said plurality of conductive layers is electrically connected to one of said plurality of external terminals, and said plurality of conductive layers are exposed from opening portions of the insulating layer at the front side and the back side of said semiconductor chip.

2. A semiconductor device according to claim 1, wherein said semiconductor chip is fixed to said tape via a buffer layer.

3. A semiconductor device according to claim 1, wherein the connection portions of said plurality of conductive layers to said plurality of external terminals are covered by a resin.

4. A semiconductor device according to claim 1, wherein a side surfaces and the back surface of said semiconductor chip are covered by a resin.

5. A semiconductor module comprising:
   a first semiconductor device which has a semiconductor chip including an integrated circuit with a plurality of external terminals, said integrated circuit being formed on a front surface of said semiconductor chip; and a tape which extends from the front surface to a back surface of said semiconductor chip and being fixed to said semiconductor chip on the front and the back sides of said semiconductor chip; wherein said tape includes insulating layers and a plurality of conductive layers that are sandwiched between said insulating layers, each of said plurality of conductive layers is electrically connected to one of said plurality of external terminals, and said plurality of conductive layers are exposed from opening portions of the insulating layer at the front side and the back side of said semiconductor chip; and
   a second semiconductor device being electrically connected to the exposed conductive layers from said opening portions.

6. A semiconductor module according to claim 5, wherein said semiconductor chip is fixed to said tape via a buffer layer.

7. A semiconductor module according to claim 5, wherein the connection portions of said plurality of conductive layers to said plurality of external terminals are covered by a resin.

8. A semiconductor module according to claim 5, wherein side surfaces and the back surface of said semiconductor chip are covered by a resin.

9. A semiconductor module comprising:

a first semiconductor device which has a semiconductor chip including an integrated circuit with a plurality of external terminals, said integrated circuit being formed on a front surface of said semiconductor chip; and a tape which extends from the front surface to a back surface of said semiconductor chip and being fixed to said semiconductor chip on the front and the back sides of said semiconductor chip; wherein said tape includes insulating layers and a plurality of conductive layers that are sandwiched between said insulating layers, each of said plurality of conductive layers is electrically connected to one of said plurality of external terminals, and said plurality of conductive layers are exposed from opening portions of the insulating layer at the front side and the back side of said semiconductor chip; and a printed circuit board being electrically connected to said first semiconductor device.

10. A semiconductor module according to claim 9, wherein said semiconductor chip is fixed to said tape via a buffer layer.

11. A semiconductor module according to claim 9, wherein the connection portions of said plurality of conductive layers to said plurality of external terminals are covered by a resin.

12. A semiconductor module according to claim 9, wherein side surfaces and the back surface of said semiconductor chip are covered by a resin.

* * * * *